(12) United States Patent
Liu et al.

(10) Patent No.: US 6,319,821 B1
(45) Date of Patent: Nov. 20, 2001

(54) DUAL DAMASCENE APPROACH FOR SMALL GEOMETRY DIMENSION

(75) Inventors: Jen-Cheng Liu, Chia-Yi; Chen-Cheng Kuo; Chia-Shiung Tsai, both of Hsin-Chu; Hung-Chang Hsieh, Shin-Tsu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/557,399

(22) Filed: Apr. 24, 2000

(51) Int. Cl.$^7$ ................................................ H01L 21/4763
(52) U.S. Cl. ............................................................ 438/636
(58) Field of Search ..................................... 438/638, 618, 438/626, 624, 631, 634, 636, 637, 700, 702, 703

(56) References Cited

U.S. PATENT DOCUMENTS

| | | | |
|---|---|---|---|
| 5,741,626 | 4/1998 | Jain et al. ............................ | 430/314 |
| 5,874,201 | 2/1999 | Licata et al. ......................... | 430/314 |
| 5,877,076 | 3/1999 | Dai ....................................... | 438/597 |
| 5,882,996 | 3/1999 | Dai ....................................... | 438/597 |
| 6,033,977 | * 3/2000 | Gutsche et al. ...................... | 438/618 |
| 6,042,999 | * 3/2000 | Lin et al. ............................. | 430/316 |

\* cited by examiner

Primary Examiner—David Nelms
Assistant Examiner—Quoc Hoang
(74) Attorney, Agent, or Firm—George O. Saile; Stephen B. Ackerman

(57) ABSTRACT

A new method is provided of trench etching of the dual damascene structure. The invention replaces the conventional ARC deposition with the deposition of I-line photoresist. The I-line photoresist serves as an anti reflective coating and eliminates, for small opening size, the problems that are encountered with conventional ARC. The deposition characteristics of the I-line photoresist can be adjusted by pre-baking the I-line photoresist prior to deposition thereby controlling its viscosity and density.

21 Claims, 5 Drawing Sheets

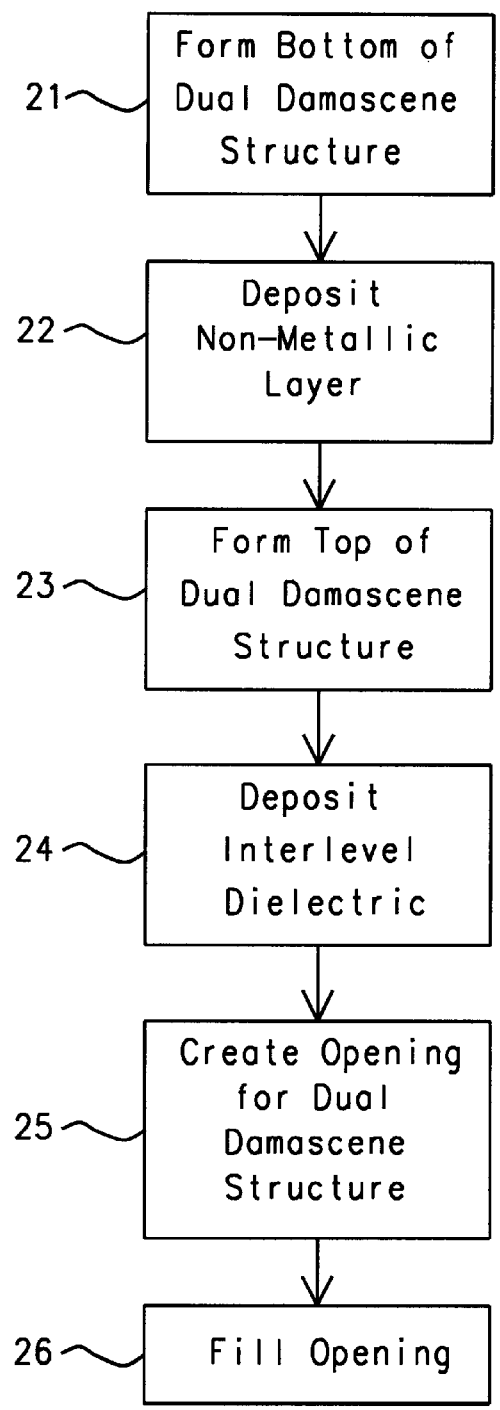
FIG. 1a – Prior Art

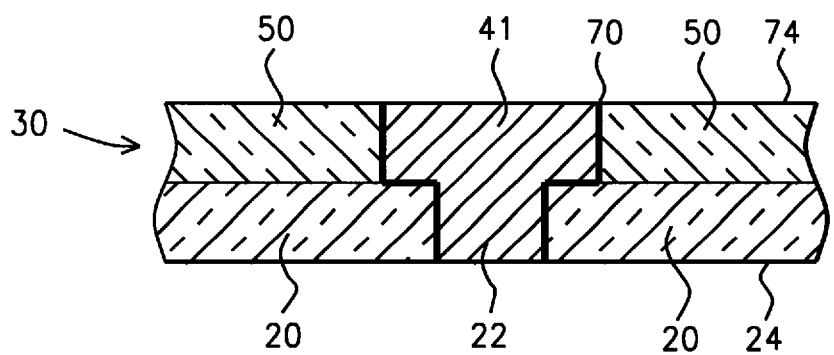
FIG. 1b – Prior Art
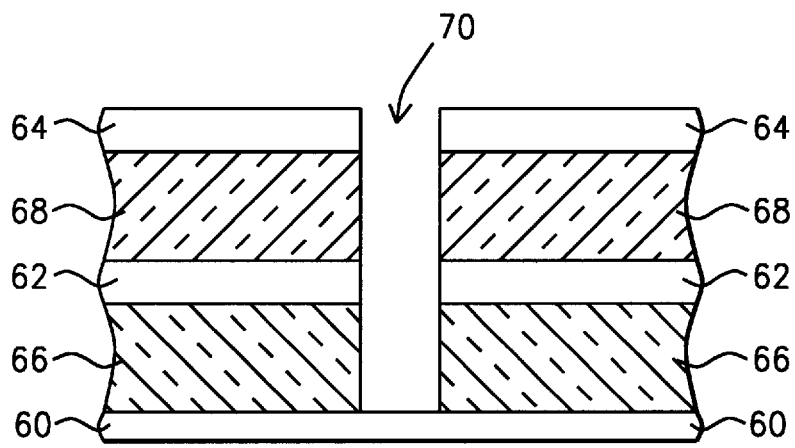
FIG. 2 – Prior Art
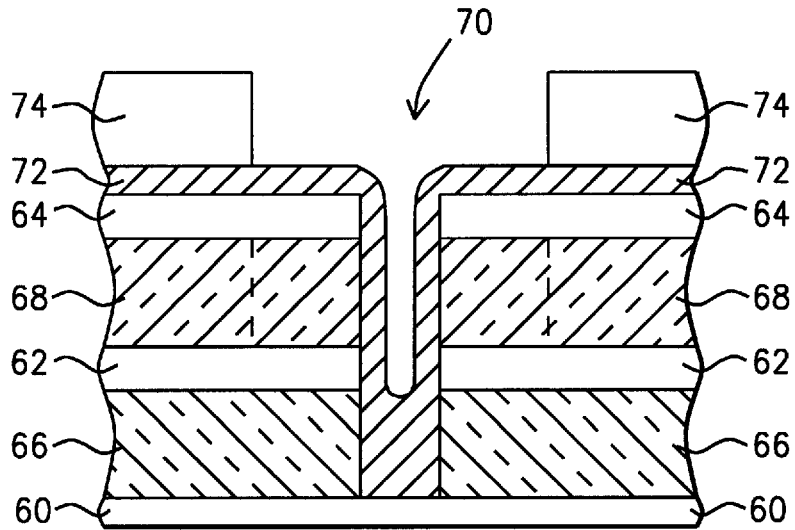
FIG. 3 – Prior Art

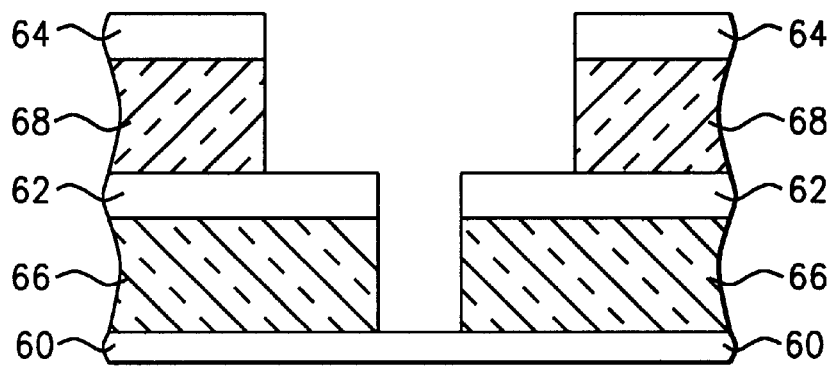
FIG. 4 - Prior Art
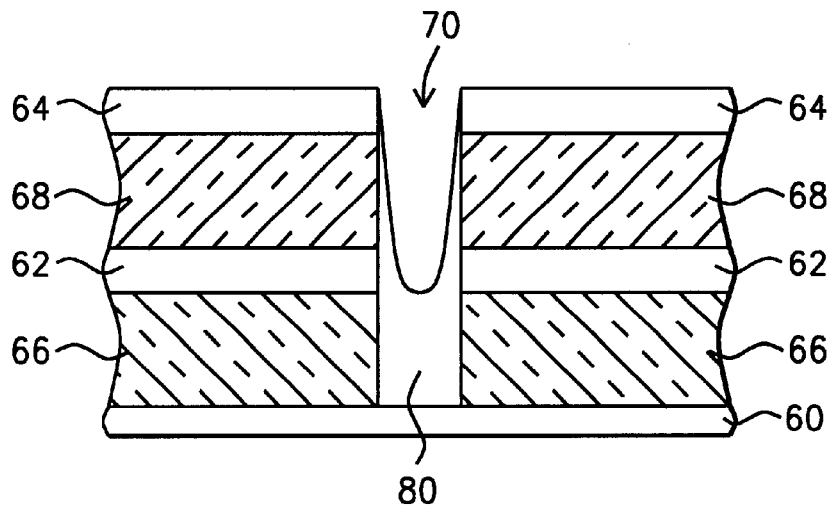
FIG. 5
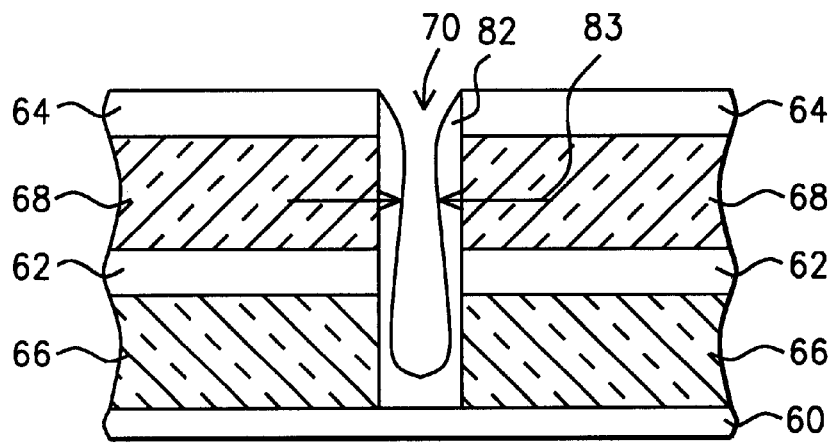
FIG. 6

DUAL DAMASCENE APPROACH FOR SMALL GEOMETRY DIMENSION

BACKGROUND OF THE INVENTION (1) Field of the Invention

The invention relates to the fabrication of integrated circuit devices, and more particularly, to a method of creating small geometry dual-damascene structures while avoiding problems of surface coating, gap-fill and bubble formations.

(2) Description of the Prior Art

In fabricating very and ultra large scale integration (VLSI and ULSI) circuits, one of the more important aspects of this fabrication is the fabrication of metal interconnect lines and vias that provide the interconnection of integrated circuits in semiconductor devices. The invention specifically addresses the fabrication of conductive lines and vias using the damascene process. Using the dual damascene process, an insulating layer or a dielectric layer, such as silicon oxide, is patterned with a multiplicity of openings for the conductive lines and vias. The openings are simultaneously filled with a metal, such as aluminum, and serve to interconnect the active and/or the passive elements of an integrated circuit. The dual damascene process is also used for forming multilevel conductive lines of metal, such as copper, in the insulating layers, such as polyimide, of multilayer substrates on which semiconductor devices are mounted. Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed. Dual damascene is an improvement over single damascene because it permits the filling of both the conductive grooves and vias with metal at the same time, thereby eliminating processing steps. The dual damascene process requires two masking steps to form first the via pattern after which the pattern for the conductive lines is formed. Critical to a good dual damascene structure is that the edges of the via openings in the lower half of the insulating layer are clearly defined. Furthermore, the alignment of the two masks is critical to assure that the pattern for the conductive lines aligns with the pattern of the vias. This requires a relatively large tolerance while the via may not extend over the full width of the conductive line.

Semiconductor device performance improvements are largely achieved by reducing device dimensions while increasing device-packaging densities. One of the major technologies that is used in the creation of semiconductor devices is photolithography. Photolithography is used to project images of device features that are contained in a reticle onto the surface where these images have to be created as device features. To obtain the required image quality and the subsequent high device yield, the images that are created in this manner must be precise and easy to repeat. This requirement of image precision brings with it that the light that is used to project the images is not deflected before reaching its target surface and not reflected upon reaching its target surface. Reflection of the projected light can occur if metal surfaces are underlying the target surface and if these metal surfaces readily reflect light. Unwanted reflections that are created by underlying layers of reflective materials are a prime source of distortion in the patterns that are created by photolithographic patterning.

To minimize the effect that reflected light has on image creation, Anti Reflective Coatings (ARC's) have been developed. These ARC's are frequently applied as a blanket deposition over the surface that caused light reflection such as a layer of metal. The coating of ARC however is an electrically conductive coating and can therefore only be applied where the application of this coating does not cause electrical short circuits between the layers over which the ARC is deposited. To prevent electrical short circuits from occurring, the ARC must be removed from between electrically conducting device features. This poses a problem for applications where dual damascene structures are being created. In the standard dual damascene process, an insulating layer is deposited over a semiconductor surface and coated with a layer of photoresist, the photoresist is exposed through a via mask with contains an image pattern of the via openings. The via pattern is anisotropically etched in the upper half of the insulating layer. The photoresist now is exposed through an interconnect line pattern mask with an image pattern of conductive line openings. The second exposure of the interconnecting line patterns is aligned with the via mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. The metal is now polished back to form an inlaid planar dual damascene structure. The metal that is used to fill the dual damascene structure is never etched meaning that no layer of ARC can be deposited over the dual damascene structures since this would cause massive electrical shorts between the dual damascene structures through the layer of ARC.

The solution to the problem of electrical shorts that are created through the deposited layer of ARC is to find materials that have ARC properties that however are not electrically conductive, such as a typical dielectric material. Some dielectric ARC's, such as silicon rich silicon nitride or aluminum nitride, are known in the art. These dielectric ARC's however prove to be not suited for use as anti reflecting coatings because these materials exhibit the combination of ARC and insulating properties only at light frequencies in the Deep Ultra Violet 248 nm wavelength range. For most of the photolithographic exposures that are applied in the creation of small geometry device size features, such as I-line or G-line processing, these exposures are made in the higher wavelength (near ultra-violet or NUV with a wavelength of 365 nm) where the optimal ARC characteristics of these materials are not present.

Accordingly, there is a need for an improved semiconductor manufacturing operation which provides the action of an anti-reflective coating and that is applicable to the more prevalent I-line or G-line processing and which can be used in applications, such as dual damascene, which require ARC's that are nonconductive and that are potentially used as a damascene etch stop layer.

FIGS. 1a and 1b graphically illustrate the conventional process of the formation of a dual damascene structure.

FIG. 1a gives and overview of the sequence of steps required in forming a Prior Art dual damascene structure. The numbers referred to in the following description of the formation of the dual damascene structure relate to the cross section of the completed dual damascene structure that is shown in FIG. 1b.

FIG. 1a, 21 shows the creation of the bottom part of the dual damascene structure by forming a via pattern 22 on a surface 24, this surface 24 can be a semiconductor wafer but is not limited to such. The via pattern 22 is created in the plane of a dielectric layer 20 and forms the lower part of the dual Damascene structure. SiO$_2$ can be used as a dielectric for layer 20.

FIG. 1a, 22 shows the deposition within plane 30 (FIG. 1b) of a layer of non-metallic material such as poly-silicon on top of the first dielectric 20 and across the vias 22, filling the via openings 22.

FIG. 1a, 23 shows the formation of the top section 41 of the dual damascene structure by forming a pattern 41 within the plane of the non-metallic layer 30. This pattern 41 mates with the pattern of the previously formed vias 22 (FIG. 1a, step 21) but it will be noted that the cross section of the opening 41 within the plane 30 of the non-metallic layer is considerably larger than the cross section of the via opening 22. After pattern 41 has been created and as part of this pattern creation step, the remainder of the non-metallic layer 30 is removed, the pattern 41 remains at this time.

FIG. 1a, 24 shows the deposition and planarization (down to the top surface of pattern 41) of an inter level dielectric (ILD) 50, a poly-silicon can be used for this dielectric.

FIG. 1a, 25 shows the creation of an opening by removing the poly-silicon from the pattern 41 and the via 22. It is apparent that this opening now has the shape of a T and that the sidewalls of the opening are not straight but show a top section that is larger than the bottom section.

FIG. 1a, 26 shows the step of filling the created opening 22/41 of the dual damascene structure with metal after which the metal is removed using CMP from the surface of layer 50 (FIG. 1b).

FIG. 1b shows the cross section of the dual Damascene structure where a barrier 70 has been formed on the sides of the created opening. The opening, which has previously been created by removing the poly-silicon from the pattern 41 and the vias 22, has been filled with a metal. Metal such as Wolfram or copper can be used for this latter processing step. The narrow lower section 22 of the dual damascene structure is frequently referred to as the via or contact section while the wider upper section 41 is frequently referred to as the trench or interconnect line section.

FIGS. 2, 3 and 4 show a Prior Art sequence of steps the are used to create a dual damascene structure using a layer of ARC.

FIG. 2 shows a cross section of the opening 70 that has been created through the two layers of dielectric 66 and 68. Layer 60 is a stop layer that has been deposited prior to the formation of the first layer of dielectric 66. Layer 60 of etch stop material is typically deposited to a thickness of 1700 Angstrom and can contain SiON. Layer 60 is the etch stop layer for etching the opening 70. Over layer 66 of dielectric a second stop layer 62 is deposited, also typically to a thickness of about 1700 Angstrom while this layer also can contain SiON. This stop layer 62 serves as the stop for the etching of the interconnect line pattern that forms the top section of the profile of the dual damascene structure. A second layer 68 of dielectric is deposited over the second stop layer 62. A final layer 64 is deposited over the surface of the second dielectric 68, this layer can contain SiON and serves as a stress relieve layer over the dielectric layer 68. The lower section (roughly below the top surface of the second stop layer 62) of opening 70 forms the plug or via section of the dual damascene structure, the upper section (roughly above the top surface of the second stop layer 62) needs to be widened (etched) in order to form the trench or interconnect pattern of the dual damascene structure. The stop layers 60, 62 and 64 of SiON can be formed to a thickness of about 1700 angstrom through a CMP method employing silane as a silicon source material and ammonia as a nitrogen source material.

FIG. 3, shows how, before the etch for the trench of the dual damascene structure takes place, an ARC layer 72 is deposited inside opening 70 and over the top surface of layer 64 of SION. This layer 72 serves the purpose that has been detailed above for the function of ARC layers. This layer 72 further serves the function of protecting the etch stop layer 60 at the bottom of this opening 70. The ARC layer 72 also allows, due to its protective nature, for a decrease in the thickness of layer 60 whereby layer 60 continues to serve as a stop layer during the first etch (to create the lower section of the dual damascene structure). The deposition of layer 72 of ARC further allows for a decrease in the thickness of the Inter Metal Dielectric (IMD) layer 68 thereby providing a level of control over the profile of the created opening of the dual damascene structure. Photoresist layer 74, deposited to a thickness of about 8000 Angstrom, forms a positive photoresist material and is deposited over the surface of layer 72 and patterned to created the trench profile of the dual damascene structure. The second layer of dielectric 68 can now be etched.

FIG. 4 shows a cross section after the latter etch has been completed. Critical dimension control of the dual damascene profile requires that all angles of corners and contours of the dual damascene are 90-degree angles.

U.S. Pat. No. 5,877,076 (Dai), U.S. Pat. No. 5,741,626 (Jain) and U.S. Pat. No. 5,882,996 (Dai) show dual damascene processes using BARC layers.

U.S. Pat. No. 5,874,201 (Licata et al.) shows a dual damascene with an organic layer.

SUMMARY OF THE INVENTION

A principle objective of the invention is to provide a method for creating small-dimension dual damascene structures that provides anti reflective coating advantages while at the same time avoiding conventional problems of poor anti reflective coating on the surface of the opening of the dual damascene structure.

Another objective of the invention is to provide a method for creating small-dimension dual damascene structures that provides anti reflective coating advantages while at the same time avoiding conventional problems of gap-fill of anti reflective coating.

Another objective of the invention is to provide a method for creating small-dimension dual damascene structures that provides anti reflective coating advantages while at the same time avoiding conventional problems of non-uniform deposition of anti reflective coating inside the opening of the dual damascene structure.

In accordance with the objectives of the invention a new method is provided of trench etching of the dual damascene structure. For dual damascene openings that are larger than 0.35 um, conventional ARC coating can be applied. This coating protects the bottom stop layer and prevents punch-through of this layer during the trench etch. Where however the size of the opening of the dual damascene structure is reduced below 0.35 um, the conventional ARC deposition suffers problems of poor coating of the ARC to the surface of the opening, of complete gap fill and of uneven deposition of the ARC inside the opening. The invention replaces the ARC deposition with the deposition of I-line photoresist. The I-line photoresist serves as an anti reflective coating and eliminates, for small opening size, the problems that are encountered with conventional ARC. The deposition characteristics of the I-line photoresist can be adjusted by pre-baking the I-line photoresist prior to deposition thereby controlling its viscosity and density.

BRIEF DESCRIPTION OF THE DRAWINGS

FIGS. 1 and 1b, 2, 3 and 4 address conventional formation of the dual damascene structure, as follows:

FIG. 1a shows a flow diagram of the processing steps that are required to form the dual damascene structure.

FIG. 1b shows a cross section of a dual damascene structure.

FIG. 2 shows the Prior Art deposition of successive layers of dielectric and stop layers in the creation of a dual damascene structure.

FIG. 3 shows the Prior Art deposition of an ARC coating and the formation of a layer of photoresist in the process of creating a dual damascene structure.

FIG. 4 shows a cross section of a Prior Art dual damascene structure that has been created using the successive layers of dielectric and stop layers of FIG. 2.

FIG. 5 shows the conventional deposition and distribution inside the dual damascene structure of a layer of ARC where the dual damascene opening is of relatively large dimension.

FIG. 6 shows the conventional deposition and distribution inside the dual damascene structure of a layer of ARC where the dual damascene opening is of relatively small dimension.

DESCRIPTION OF THE PREFERRED EMBODIMENTS

Figure 7:
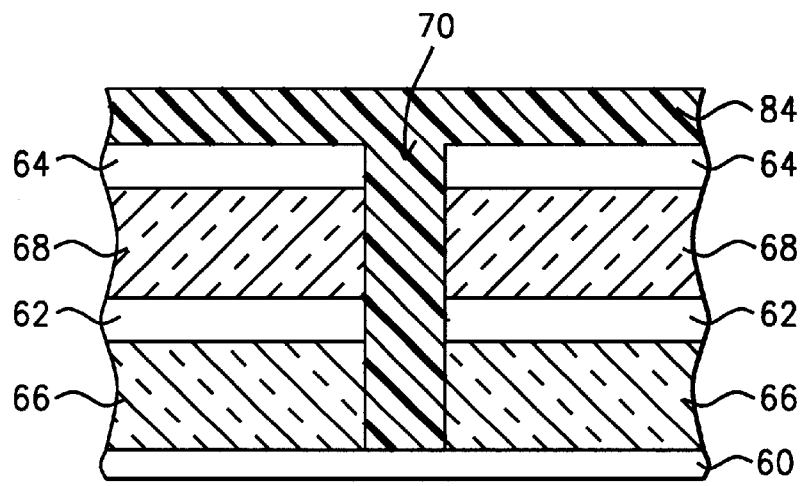
FIG. 7 shows a cross section of a dual damascene structure of the invention over which a layer of I-line photoresist has been deposited.

FIGS. 2 though 4 have highlighted the conventional approach in creating dual damascene structures whereby multiple layers of etch stop and dielectric are used to create the dual damascene profile.

FIG. 5 again shows the profile of a dual damascene structure; a layer 80 of ARC has been deposited over the surface of the structure including the opening.

The various layers that are shown in the cross section of FIG. 5 are briefly reviewed below:

layer 60 is a stop layer for etching the lower part or via of the dual damascene structure, this layer is deposited to a thickness of about 1700 angstrom and can contain SiN layer 66 is a dielectric layer, layer 66 can contain SiO and is deposited over layer 60 to a thickness between about 5000 and 10000 Angstrom layer 62 is a stop layer that has been deposited over the surface of dielectric 66, layer 62 is the etch stop layer for etching the trench of the opening 70. Layer 62 is typically deposited to a thickness of 1700 Angstrom and can contain SiN layer 68 is a dielectric layer, layer 68 can contain SiO and is deposited over layer 62 to a thickness between about 5000 and 10000 Angstrom layer 64 is deposited over the surface of the second dielectric 68, layer 64 can contain SiON and serves as a stress relieve layer over the dielectric layer 68.

The opening that is shown in cross in FIG. 5 is assumed to be a relatively large opening, that is an opening with a diameter of 0.35 um or larger. It is clear from the cross section that is shown in FIG. 5 that the layer 80 of ARC is deposited over the bottom of opening 70 to a significant thickness and therefore forms a good protective layer at the bottom of the opening for the stop layer 60.

Conventional layers of ARC are highly absorbing of energy at the photolithographic exposure range. Most ARC coating contain polymer on the surface of which a layer of photoresist is deposited and patterned for the formation of for instance metal interconnect lines. The function of the layer of ARC is to absorb most of the light energy that penetrates the layer of photoresist thereby assuring better definition of the pattern that is created by the layer of photoresist. Standard wave effects are significantly reduced by the layer of ARC. Before the application of the layer of ARC, the ARC can be pre-baked prior to the deposition of the layer of photoresist. The exact processing conditions for this pre-bake are critical and significantly influence the behavior of the ARC during subsequent steps of photoresist removal. Layer 80 of ARC can be deposited through a spin coating process followed by a thermal cure at a temperature of about 120 degrees C. for a time period of about 90 seconds to yield a blanket focusing layer when cured of a thickness of about 1500 angstrom.

It is preferred that the two layers 66 and 68 of dielectric are plasma enhanced chemical vapor deposited (PECVD) using phosphosilicate (FSG) as a source in a low pressure environment with a deposition chamber pressure of between about 0.5 and 10 torr, a temperature between about 300 and 600 degrees C. with reactant gas $SiH_4$ provided at a flow rate between about 100 and 500 sccm in a diluting carrier gas of $PH_3$ at a flow rate of between about 20 and 300 sccm.

Layers 60 and 62 form etch stop layers and can contain SiN. The upper layer 62 prevents the trench or interconnect line etch of the dual damascene structure from being etched into the lower layer 66 of dielectric because the lower layer of the dielectric is to contain the via plug hole of the dual damascene structure. The lower stop layer 60 is provided to prevent overetch into the underlying silicon substrate at the time that the via plug hole of the dual damascene structure is being etched. SiN is the preferred material for the stop layer because SiN becomes part of the composite insulation layer while it has different etch characteristics than oxide regions. As a consequence, SiN allows for different etch selectivity with respect to underlying materials such as the dielectric layer 66. Layers 60 and 62 are preferred to be deposited using PECVD to a thickness between about 500 and 2000 Angstrom. Layer 64, a stress relieve layer over the surface of the top layer 68 of dielectric, is preferred to contain SION for its better stress relieve characteristics and is deposited using PEVCD to a thickness between about 500 and 2000 Angstrom employing silane as a silicon source material and ammonia as a nitrogen source material.

After layers 60, 66, 62, 64 and 68 have been deposited, the surface of layer 64 is planarized preferably using a chemical mechanical polishing (CMP) process. A layer of photoresist (not shown) is formed on the surface of layer 64 and exposed through a dark field mask having a hole pattern that is in correspondence with the opening 70 that is created through the layers of dielectric including the top two stop layer 62 and 64. The dark field mask will expose the photoresist in the region that is above and aligns with the opening 70 thereby converting the photoresist within that region to a soluble solution that now can be removed. The via etch to create opening 70 is preferably anisotropic, RIE processing, using $CHF_3$ as an etchant.

FIG. 6 shows a cross section of a dual damascene opening that is of small dimension (0.3 um or less) and into which a layer 82 of ARC has been deposited. It is clear from the cross section that is shown in FIG. 6 that the deposited ARC inside the opening has a narrow profile at the waist 83 and is only thinly deposited over the bottom of the opening 70 thereby providing poor protection of the underlying stop layer 60 at the bottom of the opening 70.

FIG. 7 shows a cross section of the opening for a dual damascene structure where, in accordance with a key aspect of this invention, a layer 84 of I-line photoresist is deposited over the surface of the stop layer 64 thereby including the opening 70 of the dual damascene structure. I-line photoresist is a DUV photoresist with optimum light absorbing capability at a light wavelength of about 248 nm. It must be noted that the I-line photoresist of FIG. 7 fills the opening 70 completely and without forming any of the highlighted irregularities that are experienced when using conventional ARC for the filling of openings of small diameter.

The I-line photoresist layer 84 can be created by spin-coating and baking, the layer 84 of I-line photoresist is preferably deposited to a thickness of between about 2000 and 3000 Angstrom over the surface of the top stop layer 64. The I-line photoresist can, before being spun on, be pre-baked to control its density and its viscosity. The conditions for the pre-bake of the I-line photoresist vary and depend on the density (or pitch) of the openings for dual damascene structures and the geometric dimensions of these openings. Denser or narrower holes will require lower viscosity I-line photoresist, the pre-bake may therefore be extended in either time of the duration of the pre-bake or the temperature that is applied during the pre-bake. For dual damascene openings of low density, the preferred pre-bake conditions of the invention are a temperature between about 100 and 200 degree C. applied for a time of between 30 and 60 seconds. For denser hole configurations or for narrower holes the applied conditions can experimentally be derived from the preferred conditions.

Figure 8:
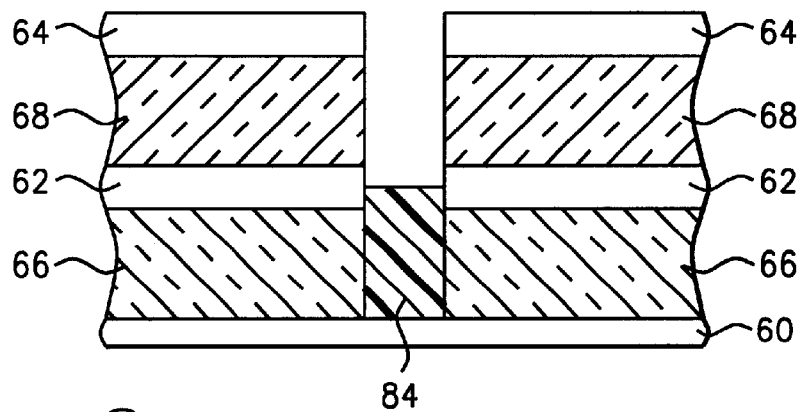
FIG. 8 shows a cross section of a dual damascene structure of the invention after the deposited layer of I-line photoresist has been etched back.

FIG. 8 shows a cross section of the dual damascene opening after, in accordance with a key aspect of this invention, the process of I-line etch back has been completed. It will be noticed that the I-line photoresist is removed from above the surface of stop layer 64 and is further removed from the upper portion of the hole for the dual damascene structure down to about the level of the stop layer 62. The processing conditions for the etch back of the I-line photoresist are as follows:

pressure of 100 mTorr power applied to the etch chamber electrodes: 500 Watt $O_2$ flow at a rate of between 20 and 50 sccm, combined with $N_2$ flow at a rate of 10 sccm, and the process is time controlled and considered complete at the point where the I-line photoresist has been removed down to the level of the second stop layer 62 of FIG. 8.

Figure 9:
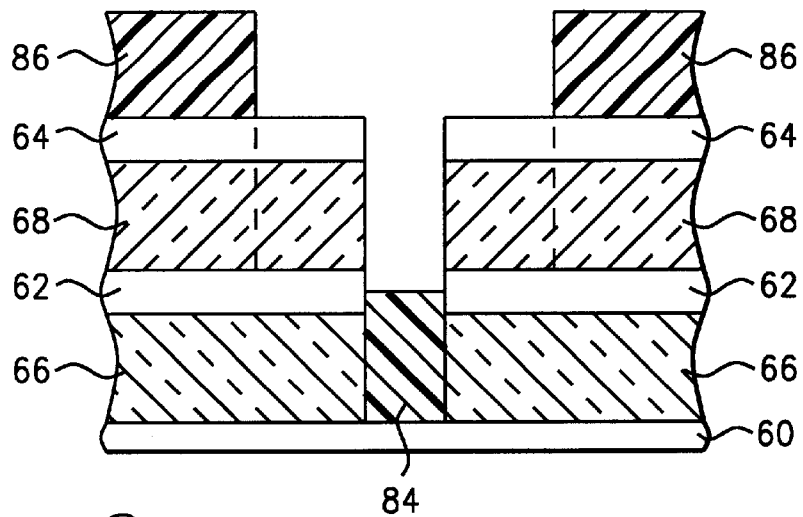
FIG. 9 shows a cross section of a dual damascene structure of the invention over which a layer of photoresist has been deposited and patterned in preparation for the trench etch.

The process of the invention is now ready for the execution of the trench etch. FIG. 9 shows a cross section after a layer of photoresist has been spin deposited over the surface of the stop layer 64. The preferred photoresist of the invention is a positive DUV type photoresist such as a chemical amplification resist (CAR). It is further preferred that the CAR comprises a photo acid generator (PAG) so that cross-linking can be achieved when exposing the layer of photoresist. To expose the layer 86 of N-type photoresist, a clear-field mask (not shown) is used, this mask has the pattern of the interconnect line or trench of the dual damascene structure. The regions that are not to be removed are exposed to an energy of about 80 milijouls/$cm^2$. After this exposure has been completed, the photoresist layer 86 can be developed in a solution that contains 2.38% TMAH in a stream puddle for about 45 to 70 seconds, only the unexposed areas of the N-type DUV photoresist are removed while the cross-linked layer remains I place. With the opening for the trench of the dual damascene structure now in place in the layer 86 of photoresist, this opening has to be transferred to the underlying layers of SiON and dielectric. The SiON layer 64 can be etched using a nitride etcher with an etchant that comprises Ar, $CHF_3$ and $CF_4$ at a flow rate of between about 50 to 150, 0 to 100 and 0 to 50 sccm. The layer 68 of dielectric can be etched for the trench pattern using a dry etch in an oxide etcher using as etchants Ar, $CHF_3$ and $C_4F_8$ at flow rates of respectively between about 50 and 150 sccm, 10 and 50 sccm and 0 to 22 sccm. The layer 68 can also be etched for the trench pattern of the dual damascene structure by using an etchant that comprises $O_2$, He and $CF_4$ at a flow rate of between about 10 to 250, 40 to 80 and 0 to 50 sccm.

The layer 86 of photoresist must next be removed from the surface of the SION stop layer 64. Photoresist stripping can be accomplished by using sulfuric acid ($H_2SO_4$) and mixtures of $H_2SO_4$ with other oxidizing agents such as hydrogen peroxide ($H_2O_2$). For instance, a frequently used mixture is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then subjected to a thorough cleaning with deionized water and dried by dry nitrogen. Photoresist can be also be etched back using a $CF_4$ gas or photoresist can be removed via oxygen plasma ashing followed by a native oxide dip for 90 sec. in a 200:1 dilute solution of hydrofluoric acid.

Figure 10:
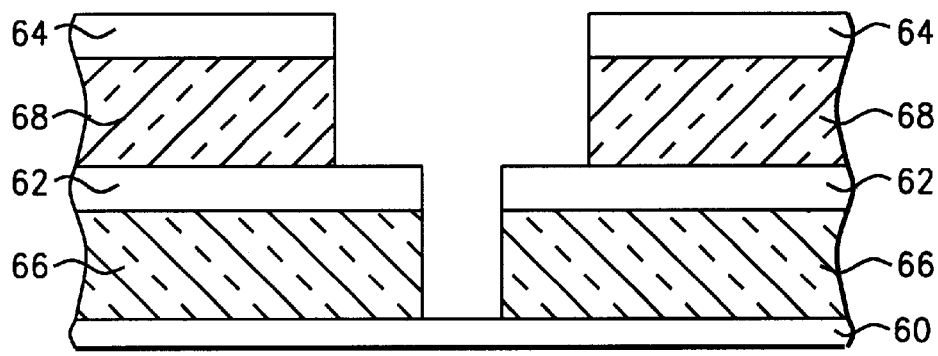
FIG. 10 shows a cross-section of a dual damascene structure of the invention after the trench etch has been completed.
Figure 11:
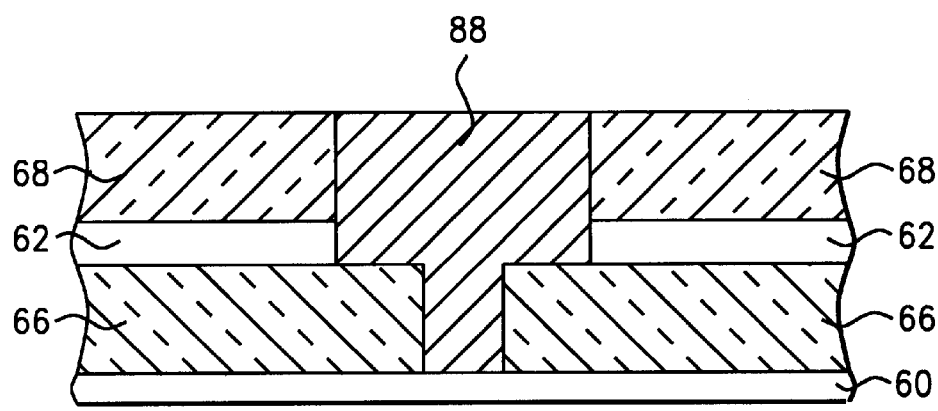
FIG. 11 shows a cross section of a dual damascene structure of the invention after the stop layers have been removed and a layer of metal has been deposited and polished forming the dual damascene structure.

FIG. 10 shows a cross section of the dual damascene structure after the processing steps that have been highlighted above under FIG. 9 have been completed. As part of the above indicated processing step of photoresist removal, the I-line photoresist has been removed from the bottom part of the hole 70 of the dual damascene structure thereby making this hole available for metal fill. Before the metal fill can be applied, the layer 64 of SiON has to be removed, this can be accomplished by dipping into hot phosphoric acid ($H_3PO_4$). The substrate is then washed and rinsed in DI water. This yields the dual damascene structure that is shown in cross section in FIG. 11. The dual damascene metal interconnect 88 is formed by depositing metal into the opening 70 and thereby filling both the via section and the interconnect line section of the structure. The narrow section of the structure can also form a contact hole depending in the underlying structure. A contact opening is generally defined as an opening made through a layer of dielectric whereby the opening exposes a diffusion region or an opening that is made through a dielectric that has been deposited between a layer of polysilicon and a layer of first level metal. Via openings are generally defined as openings that are created through other layers of oxide such as layers of inter-metal dielectric.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a dual damascene opening by using developer soluble I-line photoresist ARC fill, said dual damascene opening to contain a narrow lower or via section and a wide upper or trench section, comprising the steps of:

providing a semiconductor substrate having a composite layer of insulation deposited thereon whereby said composite layer comprising a first stop layer deposited over the surface of said substrate over which a first layer of dielectric is deposited over which a second stop layer is deposited over which a second layer of dielectric is deposited over which a third stop layer is deposited whereby said composite layer of dielectric has been patterned and etched thereby forming an opening through said composite layer down to the surface of said first stop layer said opening to have the diameter of said narrow lower or via section of said dual damascene opening;

depositing a layer of I-line photoresist fill over the surface of said composite layer of insulation thereby including said opening created through said composite layer of insulation, said depositing a layer of I-line photoresist fill is depositing said I-line photoresist to a thickness of between about 2000 and 3000 Angstrom applied through a spin coating process followed by a thermal cure at a temperature of about between about 100 and 200 degrees C. for a time period of between about 30 and 90 seconds to yield a blanket focusing layer when cured of a thickness of about 1500 angstrom;

performing an I-line photoresist etchback thereby removing said I-line photoresist from the surface of said composite layer of insulation thereby furthermore removing said I-line photoresist from essentially the top half of said opening created through said composite layer of insulation; creating the wide upper or trench section of said dual damascene opening;

removing said third stop layer from the surface of said composite layer of insulation further removing said second stop layer from the bottom of said wide upper or trench section of said dual damascene opening; and cleaning said substrate by applying DI water.

2. The method of claim 1 wherein said performing an I-line photoresist etchback is applying a pressure of between about 60 and 100 mTorr in an etch chamber with 500 Watt power applied to the etch chamber electrodes with $O_2$ flow at a rate of 20 sccm and $N_2$ flow at a rate of 10 sccm whereby the process is time controlled and considered complete at the point where the I-line photoresist has essentially been removed down to the level of said second stop layer.

3. The method of claim 1 wherein said first and second stop layers contain SiN and are formed to a thickness of between about 500 and 2000 Angstrom through a CMP method employing silane as a silicon source material and ammonia as a nitrogen source material.

4. The method of claim 1 wherein said third stop layer contains SiON and is sputter deposited to a thickness of between about 500 and 2000 Angstrom.

5. The method of claim 1 wherein said composite layer of insulation is planarized using a chemical-mechanical polishing process.

6. The method of claim 1 wherein said first and second dielectric contain SiO and are deposited using LPCVD, PECVD or APCVD processing at a temperature between about 400 to 800 degrees C. to a thickness between about 5000 and 10000 Angstrom.

7. The method of claim 1 wherein said first and second dielectric contain phosphosilicate (FSG) and are plasma enhanced chemical vapor deposited (PECVD) using as a source in a low pressure environment with a deposition chamber pressure of between about 0.5 and 10 torr, a temperature between about 300 and 600 degrees C. with reactant gas $SiH_4$ provided at a flow rate between about 100 and 500 sccm in a diluting carrier gas of $PH_3$ at a flow rate of between about 20 and 300 sccm.

8. The method of claim 1 wherein said opening through said composite layer is created by applying an anisotropic RIE etch using $CHF_3$ as etchant.

9. The method of claim 1 wherein said creating the trench section of said dual damascene opening is applying and patterning a layer of DUV photoresist over the surface of said composite layer of insulation whereby said pattern aligns with said opening through said composite layer followed by an anisotropic RIE etch using $CHF_3$ as etchant.

10. The method of claim 1 wherein said creating the trench section of said dual damascene opening is dipping into hot phosphoric acid ($H_3PO_4$) thereby removing said third stop layer of SiON further etching said second layer of dielectric with $CHF_3+Ar+CF_4$ at a flow rate of between about 50 to 150, 0 to 100 and 0 to 50 sccm respectively said removal of said SiON and said second layer of dielectric being accordance with said patterned layer of DUV photoresist.

11. The method of claim 1 wherein said creating the trench section of said dual damascene opening is dipping into hot phosphoric acid ($H_3PO_4$) thereby removing said third stop layer of SiON further etching said second layer of dielectric with an etchant that comprises $O_2$, He and $CF_4$ at a flow rate of between about 10 to 250, 40 to 80 and 0 to 50 sccm respectively said removal of said SiON and said second layer of dielectric being accordance with said patterned layer of DUV photoresist.

12. The method of claim 1 with the additional step of depositing a layer of metal over within said dual damascene opening followed by a process of polishing said deposited layer of metal thereby forming a dual damascene structure said additional step to be performed after said cleaning said substrate by applying DI water.

13. The method of claim 1 with the additional step of substrate dry and wet clean said additional step to be performed after said creating the trench section of said dual damascene opening.

14. The method of claim 1 wherein said removing said third stop layer from the surface of said composite layer of insulation further removing said second stop layer from the bottom of said trench section of said dual damascene is using a nitride etcher with an etchant that comprises Ar at a flow rate between about 50 to 150 sccm that further comprises $CHF_3$ at a flow rate of between about 0 to 100 sccm and further comprises $CF_4$ at a flow rate of between and 0 to 50 sccm.

15. A method of forming a dual damascene opening by using developer soluble I-line photoresist ARC fill, said dual damascene opening to contain a narrow lower or via section and a wide upper or trench section, comprising the steps of:

provIding a semiconductor substrate;

depositing a first stop layer of SiN over the surface of said substrate to a thickness of between about 500 and 2000 Angstrom; depositing a first layer of dielectric over the surface of said first stop layer deposited to a thickness of between about 5000 and 10000 Angstrom;

depositing a second stop layer of SiN over the surface of said first layer of dielectric to a thickness of between about 500 and 2000 Angstrom;

depositing a second layer of dielectric over the surface of said second stop layer deposited to a thickness of between about 5000 and 10000 Angstrom;

depositing a third stop layer of SiON over the surface of said second layer of dielectric to a thickness of between about 500 and 2000 Angstrom;

planarizing the surface of said third stop layer by applying a chemical mechanical polishing operation to this surface;

patterning and etching said layers of third stop layer including said second layer of dielectric including said second stop layer including said first layer of dielectric thereby creating an opening through said patterned and etched layers that has the diameter that is essentially equal to the diameter of said narrow lower or via section of said dual damascene opening;

performing a dry cleaning followed by a wet cleaning operation;

depositing a layer of I-line photoresist fill over the surface of said third stop layer thereby including said opening through said patterned and etched layers, said depositing a layer of I-line photoresist fill is depositing said I-line photoresist to a thickness of between about 2000 and 3000 Angstrom applied through a spin coating process followed by a thermal cure at a temperature of about between about 100 and 200 degrees C. for a time period of between about 30 and 90 seconds to yield a blanket focusing layer when cured of a thickness of about 1500 angstrom;

performing an I-line photoresist etchback thereby removing said I-line photoresist from the surface of said third stop layer thereby furthermore removing said I-line photoresist from essentially the top half of said opening created through said patterned and etched layers;

patterning and etching said third stop layer thereby including said second layer of dielectric thereby essentially creating the wide upper or trench section of said dual damascene opening;

reforming a dry cleaning followed by a wet clean operation; removing said third stop layer from the surface of said second layer of dielectric further removing said second stop layer from the bottom of said wide upper or trench section of said dual damascene opening; and cleaning said substrate by applying DI water.

16. The method of claim 15 wherein said performing an I-line photoresist etchback is applying a pressure of 100 mTorr in an etch chamber with 500 Watt power applied to the etch chamber electrodes with $O_2$ flow at a rate of 20 sccm and $N_2$ flow at a rate of 10 sccm whereby the process is time controlled and considered complete at the point where the I-line photoresist has essentially been removed down to the level of said second stop layer.

17. The method of claim 15 wherein said creating the wide upper or trench section of said dual damascene opening is applying and patterning a layer of DUV photoresist over the surface of said third stop layer whereby said pattern aligns with said opening through said patterned and etched layers followed by an anisotropic RIE etch using $CHF_3$ as etchant.

18. The method of claim 15 wherein said creating the wide upper or trench section of said dual damascene opening is dipping into hot phosphoric acid ($H_3PO_4$) thereby removing said third stop layer of SiON further etching said second layer of dielectric with $CHF_3+Ar+CF_4$ at a flow rate of between about 50 to 150, 0 to 100 and 0 to 50 sccm respectively said removal of said SiON and said second layer of dielectric being accordance with said patterned layer of DUV photoresist.

19. The method of claim 15 wherein said creating the wide upper or trench section of said dual damascene opening is dipping into hot phosphoric acid ($H_3PO_4$) thereby removing said third stop layer of SiON further etching said second layer of dielectric with an etchant that comprises $O_2$, He and $CF_4$ at a flow rate of between about 10 to 250, 40 to 80 and 0 to 50 sccm respectively said removal of said SiON and said second layer of dielectric being accordance with said patterned layer of DUV photoresist.

20. The method of claim 15 wherein said removing said third stop layer from the surface of said composite layer of insulation further removing said second stop layer from the bottom of said trench section of said dual damascene is using a nitride etcher with an etchant that comprises Ar at a flow rate between about 50 to 150 sccm that further comprises $CHF_3$ at a flow rate of between about 0 to 100 sccm and that further comprises $CF_4$ at a flow rate of between and 0 to 50 sccm.

21. The method of claim 15 with the additional step of depositing a layer of metal over and within said dual damascene opening followed by a process of polishing said deposited layer of metal thereby forming a dual damascene structure.

* * * * *